United States Patent
Bhagavat et al.

(10) Patent No.: US 9,751,756 B2
(45) Date of Patent: Sep. 5, 2017

(54) METHOD AND SYSTEM FOR CMOS BASED MEMS BUMP STOP CONTACT DAMAGE PREVENTION

(71) Applicant: Apple Inc., Cupertino, CA (US)

(72) Inventors: Milind S. Bhagavat, Fremont, CA (US); Richard Yeh, Los Altos, CA (US); Henry H. Yang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/451,092

(22) Filed: Aug. 4, 2014

(65) Prior Publication Data
US 2015/0291413 A1    Oct. 15, 2015

Related U.S. Application Data

(60) Provisional application No. 61/979,347, filed on Apr. 14, 2014.

(51) Int. Cl.
*H01L 21/00* (2006.01)
*B81C 1/00* (2006.01)

(52) U.S. Cl.
CPC ... *B81C 1/00825* (2013.01); *B81B 2203/0118* (2013.01); *B81B 2207/115* (2013.01)

(58) Field of Classification Search
CPC .... B81B 3/00; B81B 5/00; B81B 7/00; B81C 1/00825
See application file for complete search history.

(56) References Cited

U.S. PATENT DOCUMENTS

| | | | |
|---|---|---|---|
| 6,555,859 B2 * | 4/2003 | Adkisson | H01L 27/0629 257/204 |
| 6,670,864 B2 * | 12/2003 | Hyvonen et al. | 333/32 |
| 7,081,647 B2 | 7/2006 | Mushika | |
| 8,643,129 B2 | 2/2014 | Laming et al. | |

FOREIGN PATENT DOCUMENTS

WO    2013033725 A1    3/2013

* cited by examiner

*Primary Examiner* — Richard Booth
(74) *Attorney, Agent, or Firm* — Meyertons, Hood, Kivlin, Kowert & Goetzel, P.C.; Neal E. Persky; Lawrence J. Merkel

(57) ABSTRACT

In some embodiments, a microelectromechanical system may include a semiconductor substrate, a plurality of wiring layers, and a stop. The plurality of wiring layers may be coupled to a first surface of the semiconductor substrate. The stop may be coupled to the plurality of wiring layers. In some embodiments, at least a portion of the plurality of wiring layers between the stop and the first surface of the substrate comprises an insulating material. In some embodiments, at least the portion excludes wiring within. In some embodiments, a volume of the portion may be determined by a use of the microelectromechanical system. In some embodiments, the portion may inhibit, during use, electrical failures adjacent to the stop.

20 Claims, 4 Drawing Sheets

METHOD AND SYSTEM FOR CMOS BASED MEMS BUMP STOP CONTACT DAMAGE PREVENTION

PRIORITY CLAIM

This application claims priority to U.S. Provisional Patent Application No. 61/979,347 entitled "METHOD AND SYSTEM FOR CMOS BASED MEMS BUMP STOP CONTACT DAMAGE PREVENTION" to Bhagavat et al. filed on Apr. 14, 2014, all of which is incorporated by reference herein.

BACKGROUND

Technical Field

Embodiments described herein relate to microelectromechanical systems (MEMS) and methods. More particularly, some embodiments disclosed herein relate to a systems and methods for inhibiting structural damage and/or short circuits in MEMS resulting from inadvertent and/or excessive contact between moveable parts during use.

Description of the Related Art

MEMS devices include micromachines integrated with electronic microcircuits on substrates. MEMS may be used as, for example, microsensors or microactuators. MEMS devices may operate based upon, for example, electromagnetic, electrostrictive, thermoelectric, piezoelectric, or piezoresistive effects. MEMS devices have been formed on substrates (e.g., insulators) using micro-electronic techniques such as, for example, photolithography, vapor deposition, and etching. Recently, MEMS have been fabricated using the methods (e.g., the deposition of layers of material and the selective removal of the layers of material) that are used to fabricate conventional analog and digital complementary metal oxide semiconductor (CMOS) circuits.

MEMS are typically made up of components between 1 to 100 micrometers in thickness, and MEMS devices typically range in size from 20 micrometers to a millimeter. They usually consist of a central unit that processes data (the microprocessor) and several components that interact with the surroundings such as microsensors. At these size scales, classical physics are not always useful when trying to predict how the MEMS will function. Because of the large surface area to volume ratio of MEMS, surface effects such as electrostatics and wetting dominate over, for example, volume effects such as inertia or thermal mass.

For example, FIG. 1 depicts an embodiment of a representation of a radio frequency MEMS wafer level package 100. RE MEMS components are fragile and require wafer level packaging or single chip packaging which allow for hermetic cavity sealing. A cavity 110 is required to allow movement, whereas hermeticity is required to prevent cancellation of the spring force by the Van der Waals force exerted by water droplets and other contaminants on the beam 120. RF MEMS switches, switched capacitors and varactors can be packaged using wafer level packaging. Large monolithic RF MEMS filters, phase shifters, and tunable matching networks require single chip packaging. FIG. 1 depicts an embodiment of a representation of a radio frequency MEMS wafer level package 100 in which the systems described herein may be used.

Wafer-level packaging is implemented before wafer dicing, as shown in, and is based on anodic, metal diffusion, metal eutectic, glass frit, polymer adhesive, and silicon fusion wafer bonding. The selection of a wafer-level packaging technique is based on balancing the thermal expansion coefficients of the material layers of the RE MEMS component and those of the substrates to minimize the wafer bow and the residual stress, as well as on alignment and hermeticity requirements. Figures of merit for wafer-level packaging techniques are chip size, hermeticity, processing temperature, (in)tolerance to alignment errors, no distortion or damage of the MEMS structures, and surface roughness.

A typical MEMS design may use the CMOS Controller & Readout Chip as a Cap for Hermetic Sealing of the MEMS structure. In this case a portion of a top dielectric layer of a complementary metal-oxide semiconductor (CMOS) can be used as a bump stop. The bump stop is supposed to inhibit damage to the semiconductor as well as MEMS structures during use of the MEMS. Cracks may form below the bump stops due to impacts with the stops. These structural failures within the semiconductor may lead to, for example, electrical failures which ultimately lead to failure of the MEMS itself. Cracks or other forms of damage may also be formed in the MEMS structure where it impacts the stopper. This can lead to particle shedding which can impede the functioning of MEMS structures as well as could lead to shorts in CMOS circuitry

SUMMARY

Embodiments described herein are directed towards providing a structure which inhibits a common source of structural damage during use or handling of MEMS. A typical MEMS design uses a portion of a top dielectric layer of a CMOS as a bump stop. The bump stop is supposed to inhibit damage to the semiconductor during use of the MEMS and also at the same time it is supposed to inhibit any damage to the MEMS because of over-drive etc. Cracks may form below the bump stops due to impacts with the stops or the MEMS structural membrane may get damaged in the regions where it hits the bumps. This may lead to shedding of particles which can electrically short MEMS structures as well as CMOS circuitry. These structural failures within the semiconductor and MEMS may lead to, for example, electrical failures which ultimately lead to failure of the MEMS itself. To correct this flaw, in some embodiments, a zone below the bump stop may be configured such that wiring is excluded from the layers forming the semiconductor. In some embodiments, the zone may be formed at least in part of an insulating material. In some embodiments, the insulating material selected may have hardness and a toughness which is comparable to the MEMS mechanical structure.

In some embodiments, a microelectromechanical system may include a semiconductor substrate, a plurality of wiring layers, and a stop. The plurality of wiring layers may be coupled to a first surface of the semiconductor substrate. The stop may be coupled to the plurality of wiring layers. In some embodiments, at least a portion of the plurality of wiring layers between the stop and the first surface of the substrate comprises an insulating material. In some embodiments, at least the portion excludes wiring within. In some embodiments, a volume of the portion may be determined by a use of the microelectromechanical system. In some embodiments, the portion may inhibit, during use, electrical failures adjacent to the stop.

The insulating material selected should have hardness and toughness which is comparable to MEMS mechanical structure

BRIEF DESCRIPTION OF THE DRAWINGS

The following detailed description makes reference to the accompanying drawings, which are now briefly described.

Figure 1:
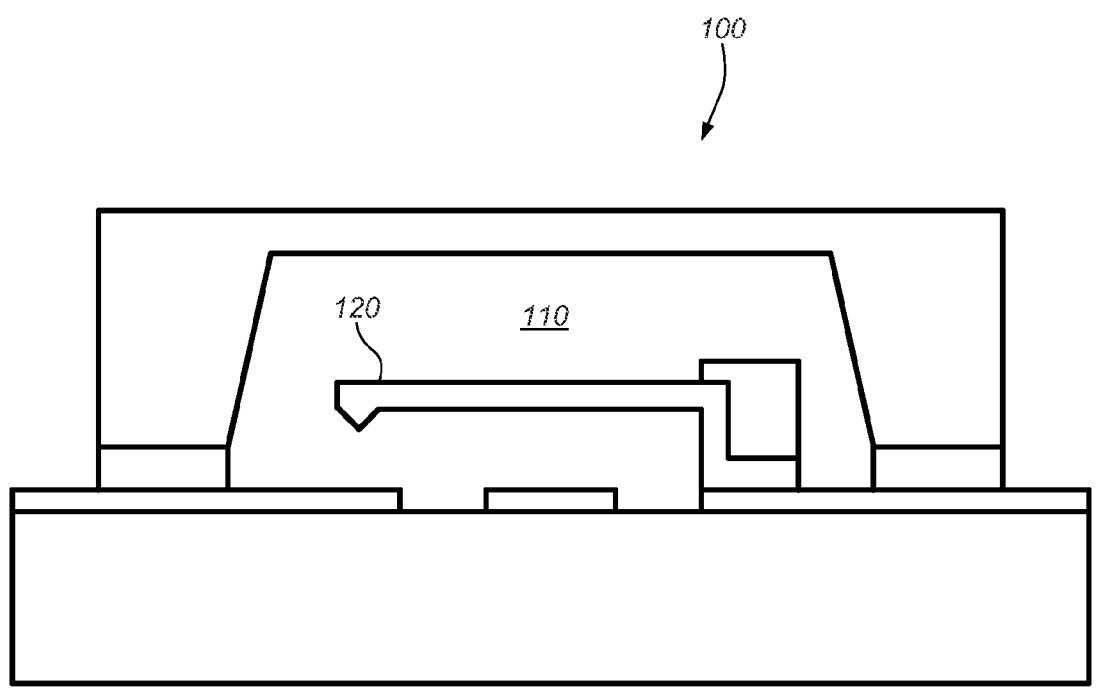
FIG. 1 depicts an embodiment of a representation of a radio frequency MEMS wafer level package.

Specific embodiments are shown by way of example in the drawings and will be described herein in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Figure 2:
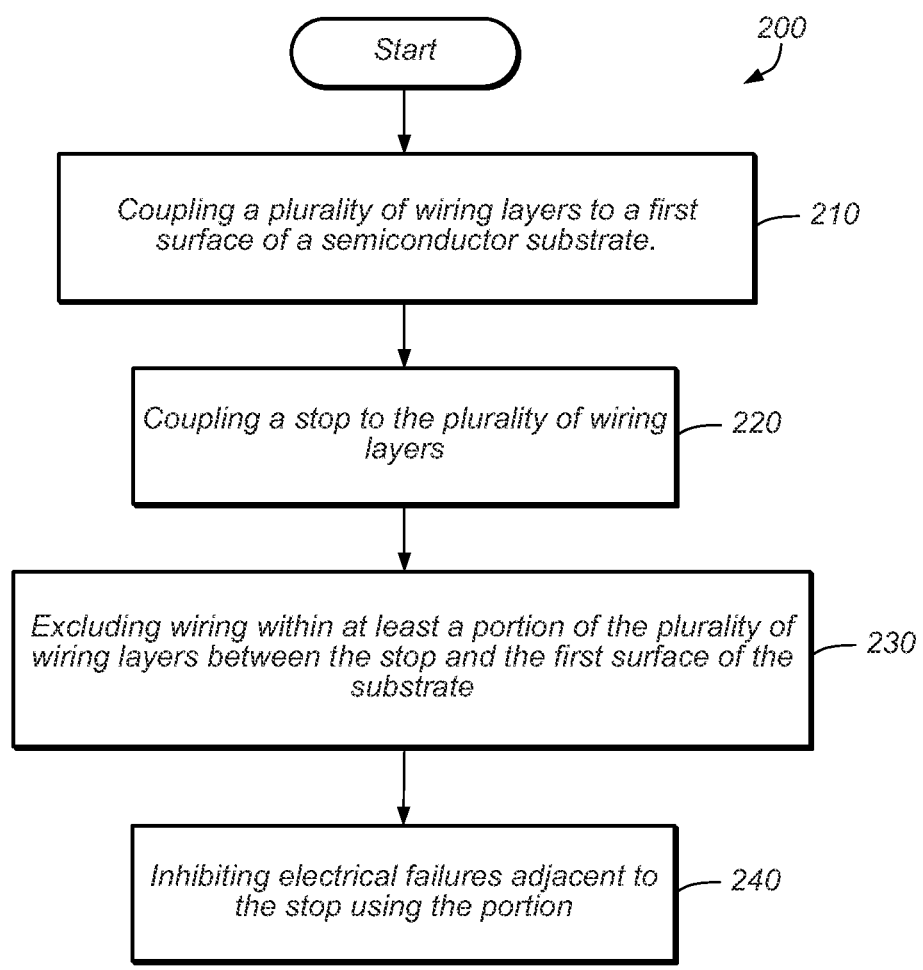
FIG. 2 depicts an embodiment of a flowchart representing a method of inhibiting electrical failures adjacent a stop on a die (e.g., CMOS) of a MEMS.
Figure 3:
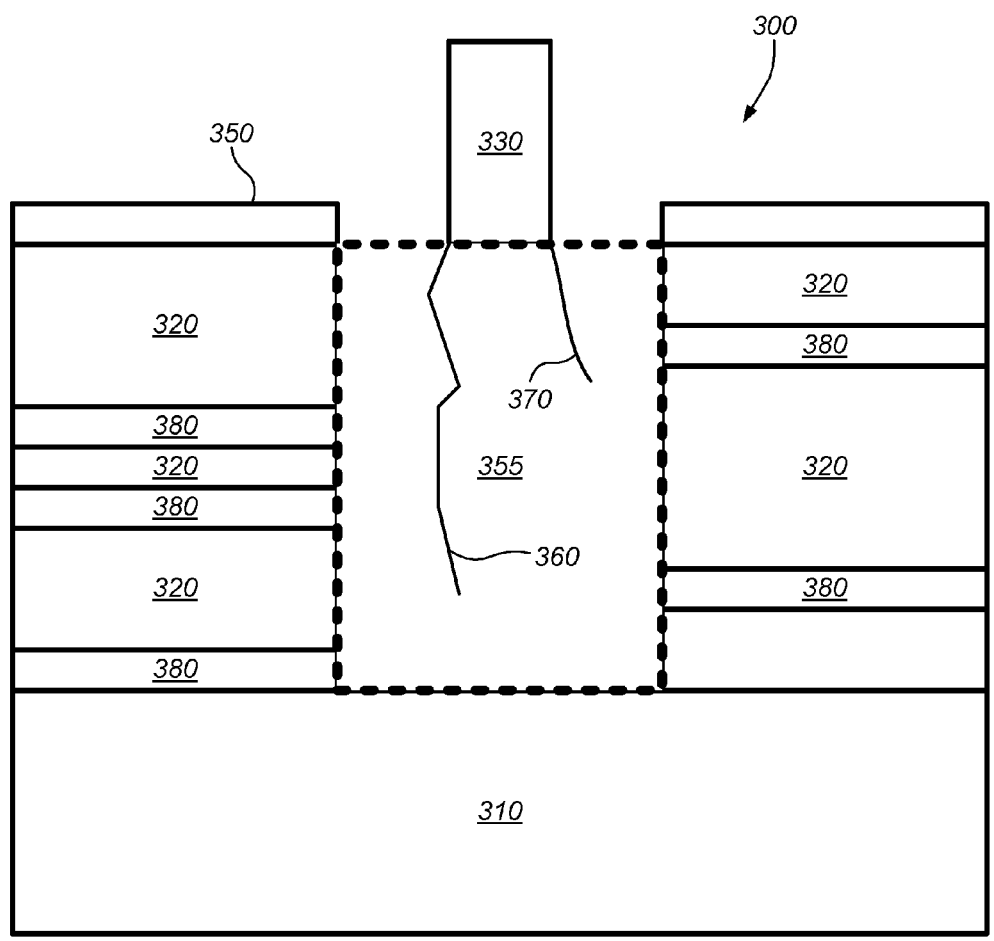
FIGS. 3-4 depict an embodiment of a representation of a part of a die (e.g., CMOS) used to form a portion of a MEMS.
Figure 4:
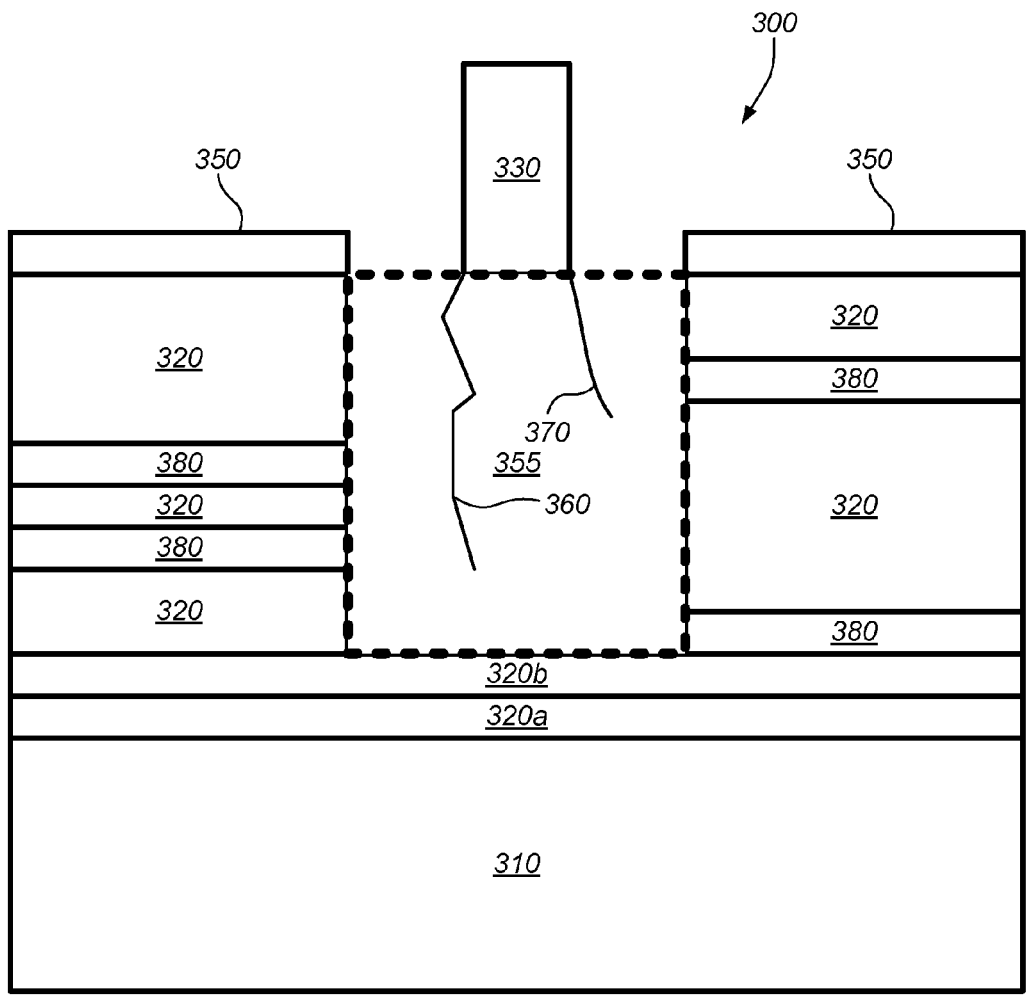

FIG. 2 depicts an embodiment of a flowchart representing a method 200 of inhibiting electrical failures adjacent a stop on a die (e.g., CMOS) of a MEMS. FIGS. 3-4 depict an embodiment of a representation of a part 300 of a die (e.g., CMOS) used to form a portion of a MEMS. In some embodiments, a microelectromechanical system may include a semiconductor substrate 310, a plurality of wiring layers 320, and a stop 330. The plurality of wiring layers 320 may be coupled (210) to a first surface 340 of the semiconductor substrate 310. The stop may be coupled (220) to the plurality of wiring layers. In some embodiments, the MEMS may be a radio frequency MEMS wafer level package 100, such as depicted in FIG. 1. FIG. 1 depicts an embodiment of a representation of a radio frequency MEMS wafer level package 100 in which the systems described herein may be used.

The stop may include an elevated topography. The topography of the stop may be elevated relative to an upper level of the die. The stop may function to inhibit damage to a die. The stop may inhibit a second portion of the MEMS from impacting an upper portion 350 of the die. In some embodiments, the stop may reduce a force with which a second portion of the MEMS impacts an upper portion 350 of the die. In many MEMS part of the design requires that a portion of the MEMS contacts and/or comes close to contacting an upper portion of the die.

Even in MEMS where contact is required for proper functioning there are naturally limits to the amount of force which is required (e.g., for activation of the MEMS) or even desirable (e.g., due to inadvertent structural damage). Hence stops are used to reduce and/or inhibit contact between movable portion(s) of the MEMS and the die. Problems arise from continued impacts and/or excessive impacts out of the design bounds (e.g., if the product with the MEMS is dropped accidentally (e.g., a cellular phone). Designed impacts over time and/or excessive impacts may lead to structural damage within the die, typically, below the stop. Structural damage 360 may include small cracks in the die. Structural damage may create potential connection paths between metal layers 380 in the plurality of wiring layers of the die. Connection paths may result in electrical connections between metal layers 380. Inadvertent electrical connections within the die may result in electrical shorts and ultimately failure of the MEMS.

A stop may be formed from the etching process phase of forming a die. Etchants used during the etching process may damage 370 portions of the die adjacent to the stop. Etchants may collect near a wall of the stop damaging an area adjacent the stop. Damage resulting from the etchants may create potential connection paths between metal layers 380 in the plurality of wiring layers of the die. Connection paths may result in electrical connections between metal layers 380. Inadvertent electrical connections within the die may result in electrical shorts and ultimately failure of the MEMS.

The bump stop has a high topography relative to the rest of the die, which is how the bump stop protects the upper surface of the die. During the bump stop forming process, etchants near the wall may cause damage near the wall of the bump stop, creating potential connection path for any two metal layers. Ion implantation may be used during the fabrication of semiconductor devices. The introduction of dopants in a semiconductor is the most common application of ion implantation. Ion implantation may result in some instances in damaging a die or semiconductor during fabrication. Each individual ion produces many point defects in the target crystal on impact such as vacancies (i.e., crystal lattice points unoccupied by an atom) and interstitials. The ion collides with a target atom, resulting in transfer of a significant amount of energy to the target atom such that it leaves its crystal site. The target atom becomes a projectile in the solid, and can cause successive collision events. Interstitials result when such atoms (or the original ion itself) come to rest in the solid, but find no vacant space in the lattice to reside. These point defects can migrate and cluster with each other, resulting in dislocation loops and other defects. This ion bombardment may cause relatively greater damage near a step transition found along a surface of the die. In some embodiments, the portion 355 may inhibit the ion bombardment that is commonly found near a step transition. These step transitions may cause accelerated ions to create damages vertically near the footing of the steps. In some embodiments, the damage caused by the ion bombardment may damage the structure of the die adjacent the step transition of the bump stop resulting in short circuits between the metal wiring and/or electrical failures. Structural damage may include cracks (e.g., vertical cracks) in the die which may lead to potential connection paths between any two metal wiring layers.

In some embodiments, at least a portion 355 of the plurality of wiring layers between the stop and the first surface of the substrate comprises an insulating material. In some embodiments, at least the portion excludes (230) wiring within the portion. In some embodiments, the plurality of wiring layers between the stop and the first surface of the substrate is formed from an insulating material and excludes wiring. In some embodiments, the insulating material selected may have hardness and a toughness which is comparable to the MEMS mechanical structure. In some embodiments, at least an upper portion of the stop may have hardness and a toughness which is comparable to the MEMS mechanical structure. To hard and the top insulating material of bump would result in damage to the structural material. This can lead to particle shedding and these particles could ultimately electrically short MEMS structures or CMOS circuitry. An example may be—with silicon as MEMS mechanical structural material, it is preferred to have silicon or silicon nitride as topmost layer of bump. Silicon oxide is considerably harder than silicon and hence may be avoided in some embodiments.

FIG. 3 depicts an embodiment of a representation of a part 300 of a die used to form a portion of a MEMS. In the embodiment depicted in FIG. 3 the portion 355 of the plurality of wiring layers extends between the stop and the first surface of the substrate. FIG. 4 depicts an embodiment of a representation of a part 300 of a die used to form a portion of a MEMS. In the embodiment depicted in FIG. 4 the portion 355 of the plurality of wiring layers may extend between the stop and several lower layers 320*a-b* of the plurality of wiring layers.

Removing the wiring from the portion may inhibit damage to the die and potentially the MEMS from connection paths formed via structural damage. As such structural damage if limited or substantially limited to the portion may not form connection paths between metal layers 380.

As mentioned the portion may be formed from an insulating material. The insulating material may inhibit formation of connection pathways (e.g., electrical pathways).

In some embodiments, the insulating material comprises an electrically nonconductive material. The insulating material may include silicon dioxide. The insulating material may include silicate glass. In some embodiments, low dielectric constant materials may be used as an insulating material. Low dielectric constant materials may include, for example, silicon oxycarbide.

In some embodiments, the portion 355 of the plurality of wiring layers may be formed during manufacture of the die using a router. More specifically a place and route (PNR) tool may be used to form the portion in combination with PNR design software (or at least the space into which the insulating material may be positioned).

Once the semiconductor has been manufactured, the die may go through a verification process. Design Rule Check (DRC) and Layout Versus Schematic (LVS) are verification processes which may be used to verify there are no mistakes or defects in the newly manufactured die. Reliable device fabrication at modern deep-submicrometer (0.13 μm and below) requires strict observance of transistor spacing, metal layer thickness, and power density rules. DRC compares the physical netlist against a set of foundry design rules, then notes any observed violations.

The LVS process confirms the layout has the same structure as the associated schematic. This confirmation is typically the final step in the layout process. The LVS tool takes a schematic diagram and the extracted view from a layout. The LVS tool then generates a netlist from each one and compares the netlists. For example, nodes, ports, and device sizing may all be compared. If they are the same, LVS passes the layout and the process may continue.

In some embodiments, the portion of the die may be formed from a structurally reinforced material, relative to the plurality of wiring layers. Structural reinforcing may inhibit structural damage (e.g., cracks) in the portion of the die below the stop. For example, fibers may be used to structurally reinforce the portion of the die below and/or adjacent the stop. Fibers may be electrically non-conducting.

In some embodiments, a volume of the portion may be determined by a use of the microelectromechanical system. In some embodiments, a volume of the portion is determined by a relative motion within the microelectromechanical system relative to the stop. MEMS are designed and used for a variety of purposes throughout society. Some of the MEMS have greater relative movements of the constituent parts (e.g., relative to an upper surface of the die) than other MEMS. As such there are MEMS which have a greater incidence of damage due to impacts between an upper surface of the die and a movable part of a MEMS.

Excessive force exerted by a movable part against the upper surface may be due to a designated use of the MEMS and/or due to accidental occurrences (which may be more common place for a particular type of device using a MEMS). As such, in some embodiments, for dies in MEMS exposed to excessive forces a volume of the portion below the stop may be increased to compensate for increased occurrences and/or severity of structural damage. In some embodiments, as an average force applied to a die stop is increased the volume of the portion under the stop may be increased proportionally. For example, FIG. 4 depicts an embodiment of a part of a die wherein the volume of the portion 355 is smaller than the portion 355 depicted in FIG. 3.

In some embodiments, the portion may inhibit (240), during use, electrical failures adjacent to the stop. In some embodiments, the portion may inhibit, during use, electrical failures adjacent to the stop associated with structural failures within the portion. Electrical failures may include short circuits between metal layers in the plurality of wiring layers.

In some embodiments, the microelectromechanical system may include an accelerometer, a gyroscope, a microphone, or a pressure sensor. More generally, in some embodiments, methods and systems described herein may be used in the production of application-specific integrated circuits (ASIC) for use in MEMS. An ASIC is an integrated circuit (IC) customized for a particular use, rather than intended for general-purpose use. For example, a chip designed to run in a digital voice recorder is an ASIC.

Numerous variations and modifications will become apparent to those skilled in the art once the above disclosure is fully appreciated. It is intended that the following claims be interpreted to embrace all such variations and modifications.

What is claimed is:

1. A microelectromechanical system, comprising:
  a semiconductor substrate comprising a first surface;
  a plurality of wiring layers coupled to the first surface of the semiconductor substrate, wherein at least a part of the plurality of wiring layers are stacked relative to each other; and
  a stop coupled directly to the plurality of wiring layers, wherein at least a portion of the stacked plurality of wiring layers between the stop and the first surface of the substrate comprises an insulating material and excludes wiring within at least the portion such that wiring from the plurality of wiring layers extend around the insulating material between the stop and the first surface of the substrate.

2. The system of claim 1, wherein all of the plurality of wiring layers between the stop and the first surface of the substrate is formed from an insulating material and excludes wiring.

3. The system of claim 1, wherein the stop inhibits, during use, contact of a movable portion of the system from contacting the plurality of wiring layers with excessive force.

4. The system of claim 1, wherein a volume of the portion is determined by a use of the microelectromechanical system.

5. The system of claim 1, wherein a volume of the portion is determined by a relative motion within the microelectromechanical system relative to the stop.

6. The system of claim 1, wherein the portion inhibits, during use, electrical failures adjacent to the stop.

7. The system of claim 1, wherein the portion inhibits, during use, electrical failures adjacent to the stop associated with structural failures within the portion.

8. The system of claim 1, wherein the portion inhibits, during use, structural failures adjacent to the stop using the portion, and wherein the structural failures result from ion bombardment.

9. The system of claim 1, wherein the insulating material comprises an electrically nonconductive material.

10. The system of claim 1, wherein the microelectromechanical system comprises an accelerometer, a gyroscope, a microphone, or a pressure sensor.

11. A microelectromechanical system, comprising:
  a semiconductor substrate comprising a first surface;
  a plurality of wiring layers coupled to the first surface of the semiconductor substrate, wherein at least a part of the plurality of wiring layers are stacked relative to each other; and
  a stop coupled directly to the plurality of wiring layers, wherein at least a portion of the stacked plurality of wiring layers between the stop and the first surface of the substrate comprises an insulating material such that wiring from the plurality of wiring layers extend around the insulating material between the stop and the first surface of the substrate, wherein a volume of the portion is determined by a relative motion within the microelectromechanical system relative to the stop, and wherein the stop inhibits, during use, contact of a movable portion of the system from contacting the plurality of wiring layers with excessive force.

12. The system of claim 11, wherein all of the portion of the plurality of wiring layers between the stop and the first surface of the substrate excludes wiring within at least the portion.

13. The system of claim 11, wherein a volume of the portion is determined by a use of the microelectromechanical system.

14. The system of claim 11, wherein the portion inhibits, during use, electrical failures adjacent to the stop.

15. The system of claim 11, wherein the portion inhibits, during use, electrical failures adjacent to the stop associated with structural failures within the portion.

16. The system of claim 11, wherein the portion inhibits, during use, structural failures adjacent to the stop using the portion, and wherein the structural failures result from ion bombardment.

17. The system of claim 11, wherein the insulating material comprises an electrically nonconductive material.

18. The system of claim 11, wherein the microelectromechanical system comprises an accelerometer, a gyroscope, a microphone, or a pressure sensor.

19. The system of claim 1, wherein the plurality of wiring layers extends below the insulating material.

20. The system of claim 11, wherein the plurality of wiring layers extends below the insulating material.

* * * * *